United States Patent
Chiu et al.

(10) Patent No.: US 10,056,347 B2
(45) Date of Patent: Aug. 21, 2018

(54) BUMP STRUCTURE FOR YIELD IMPROVEMENT

(71) Applicant: Taiwan Semiconductor Manufacturing Company, Ltd., Hsin-Chu (TW)

(72) Inventors: Tzu-Wei Chiu, Hsin-Chu (TW); Tzu-Yu Wang, Taipei (TW); Shang-Yun Hou, Jubei (TW); Shin-Puu Jeng, Hsin-Chu (TW); Hsien-Wei Chen, Hsin-Chu (TW); Hung-An Teng, Taoyuan (TW); Wei-Cheng Wu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 15/413,058

(22) Filed: Jan. 23, 2017

(65) Prior Publication Data

US 2017/0133346 A1    May 11, 2017

Related U.S. Application Data

(62) Division of application No. 13/558,082, filed on Jul. 25, 2012, now Pat. No. 9,553,053.

(51) Int. Cl.
*H01L 21/44* (2006.01)
*H01L 23/00* (2006.01)
(Continued)

(52) U.S. Cl.
CPC ............ *H01L 24/81* (2013.01); *B23K 1/0016* (2013.01); *C23C 14/165* (2013.01); *C23C 14/34* (2013.01); *C23C 18/32* (2013.01); *C23C 18/42* (2013.01); *H01L 24/11* (2013.01); *H01L 24/13* (2013.01); *H01L 24/16* (2013.01); *H01L 25/0657* (2013.01); *H01L 25/50* (2013.01); *H01L 2224/114* (2013.01); *H01L 2224/119* (2013.01); *H01L 2224/1145* (2013.01); *H01L 2224/1146* (2013.01); *H01L 2224/1147* (2013.01); *H01L 2224/11903* (2013.01);

(Continued)

(58) Field of Classification Search
CPC .......... H01L 24/81; H01L 2224/13019; H01L 2224/119; H01L 2224/11903; H01L 2224/114
USPC .................. 257/737, E23.021; 438/613, 614
See application file for complete search history.

(56) References Cited

U.S. PATENT DOCUMENTS 5,121,299 A    6/1992  Frankeny et al.
7,015,590 B2   3/2006  Jeong et al.
(Continued)

FOREIGN PATENT DOCUMENTS

TW           200725851         7/2007

*Primary Examiner* — Robert Huber
(74) *Attorney, Agent, or Firm* — Slater Matsil, LLP

(57) ABSTRACT

A bump structure for electrically coupling semiconductor components is provided. The bump structure includes a first bump on a first semiconductor component and a second bump on a second semiconductor component. The first bump has a first non-flat portion (e.g., a convex projection) and the second bump has a second non-flat portion (e.g., a concave recess). The bump structure also includes a solder joint formed between the first and second non-flat portions to electrically couple the semiconductor components.

21 Claims, 13 Drawing Sheets

(51) Int. Cl.
  H01L 25/00 (2006.01)
  H01L 25/065 (2006.01)
  B23K 1/00 (2006.01)
  C23C 18/32 (2006.01)
  C23C 18/42 (2006.01)
  C23C 14/16 (2006.01)
  C23C 14/34 (2006.01)

(52) U.S. Cl.
  CPC ........... *H01L 2224/13019* (2013.01); *H01L 2224/13082* (2013.01); *H01L 2224/13147* (2013.01); *H01L 2224/13166* (2013.01); *H01L 2224/13564* (2013.01); *H01L 2224/13644* (2013.01); *H01L 2224/13655* (2013.01); *H01L 2224/13664* (2013.01); *H01L 2224/16148* (2013.01); *H01L 2224/8112* (2013.01); *H01L 2224/81193* (2013.01); *H01L 2224/81345* (2013.01); *H01L 2224/81365* (2013.01); *H01L 2224/81815* (2013.01); *H01L 2225/06513* (2013.01); *H01L 2225/06593* (2013.01); *H01L 2924/014* (2013.01)

(56) References Cited

U.S. PATENT DOCUMENTS

| | | |
|---|---|---|
| 7,332,423 B2 | 2/2008 | Starkston et al. |
| 7,952,206 B2 * | 5/2011 | Bachman ............ H01L 24/03 257/737 |
| 2008/0029888 A1 | 2/2008 | Park et al. |
| 2009/0242258 A1 | 10/2009 | So et al. |
| 2009/0302469 A1 | 12/2009 | Masuda et al. |
| 2010/0320258 A1 | 12/2010 | Sawada et al. |
| 2012/0306104 A1 | 12/2012 | Choi et al. |
| 2013/0256871 A1 * | 10/2013 | Topacio ............ H01L 23/3171 257/737 |

\* cited by examiner

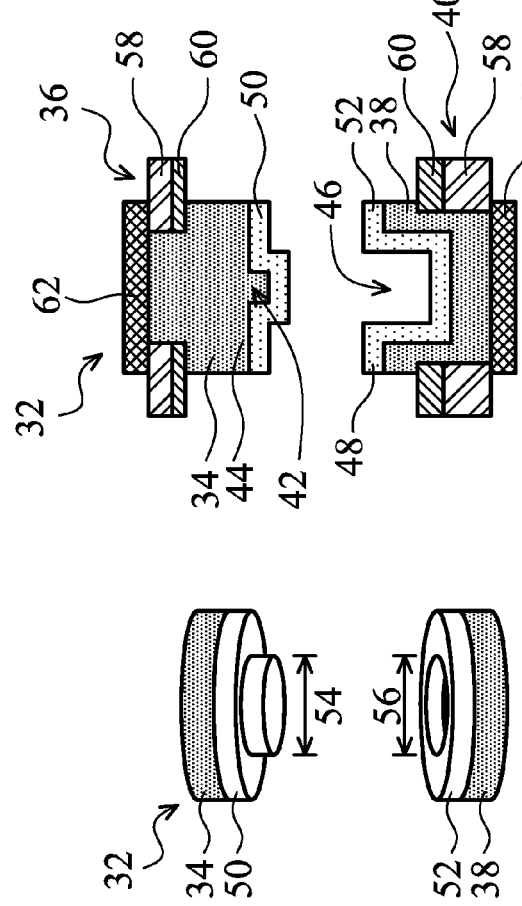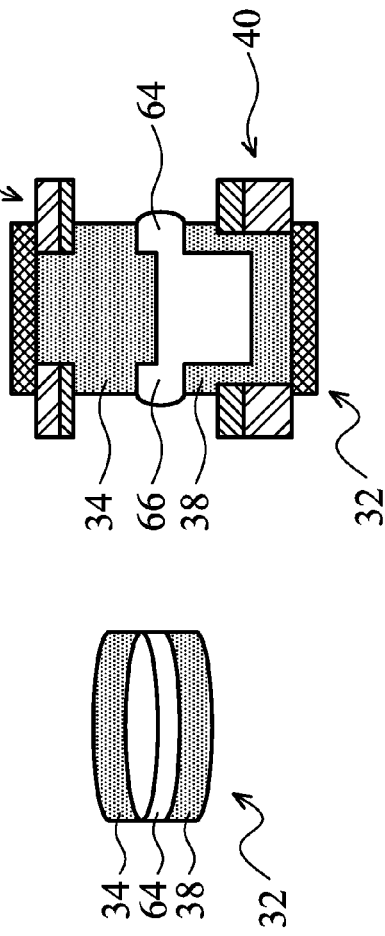

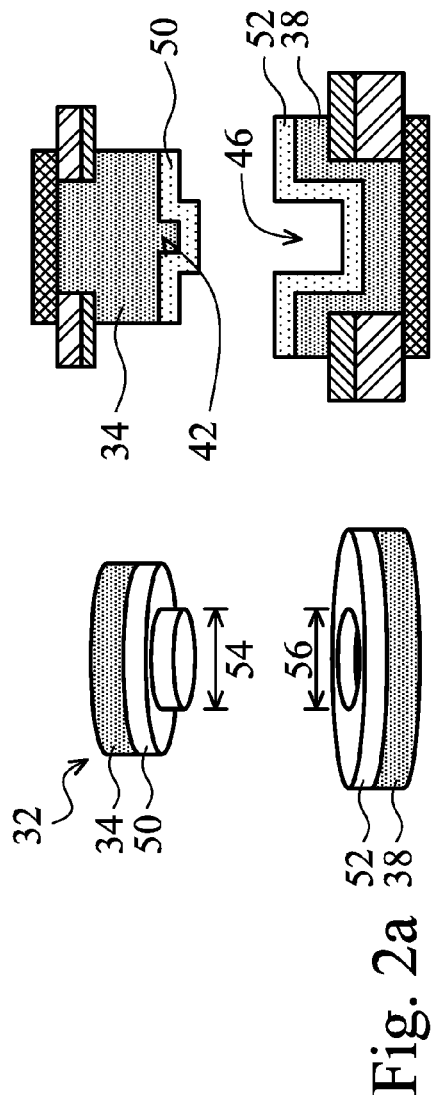
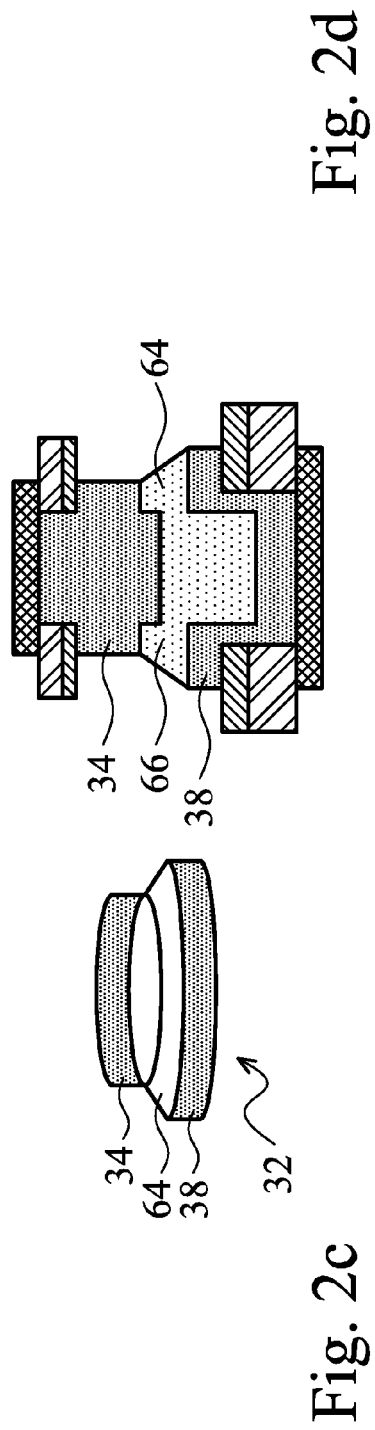
Fig. 2a  Fig. 2b
Fig. 2c  Fig. 2d

When w1=25μm, 50μm, 100μm

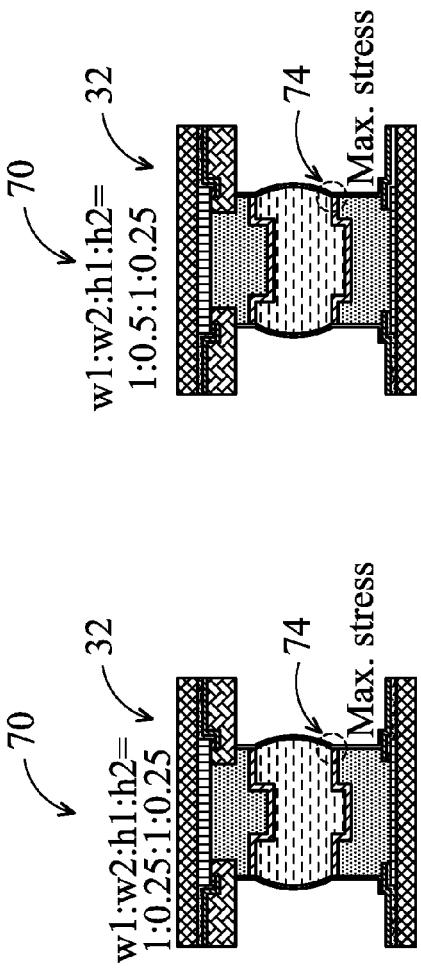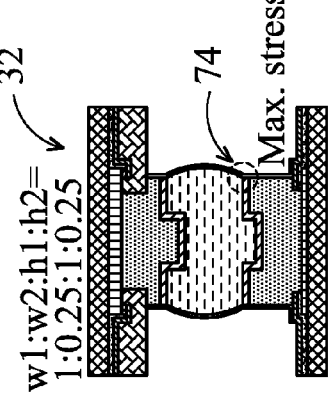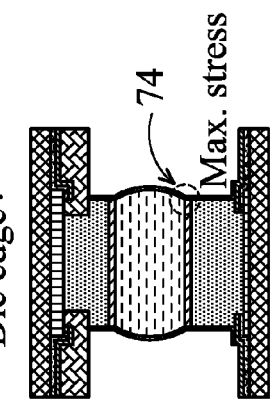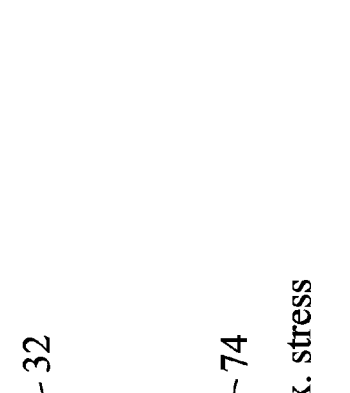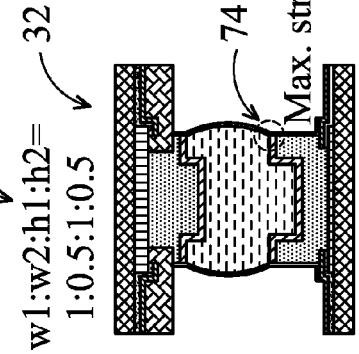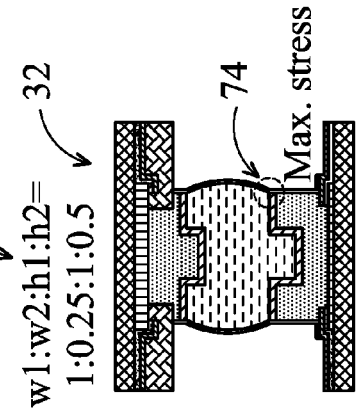

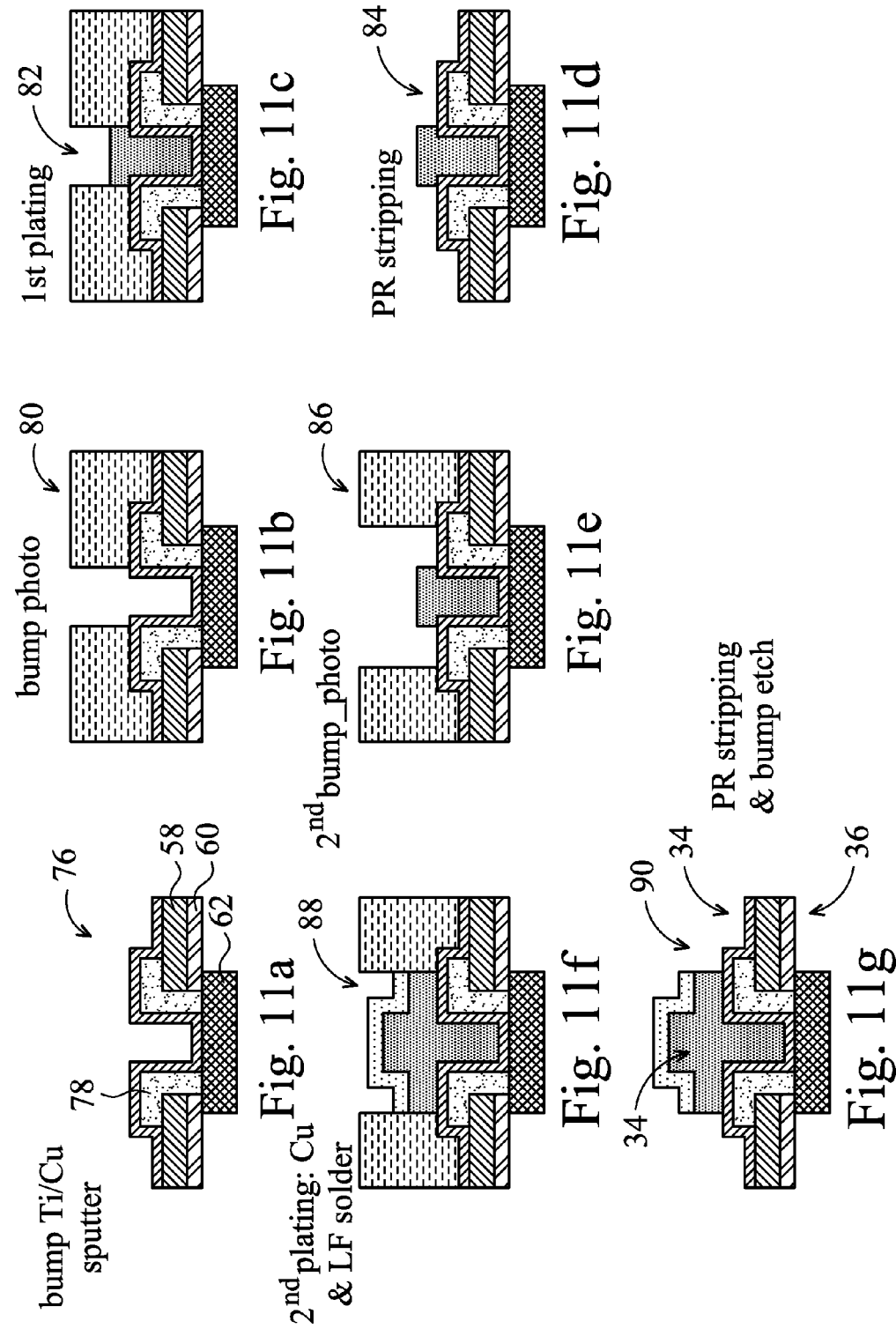

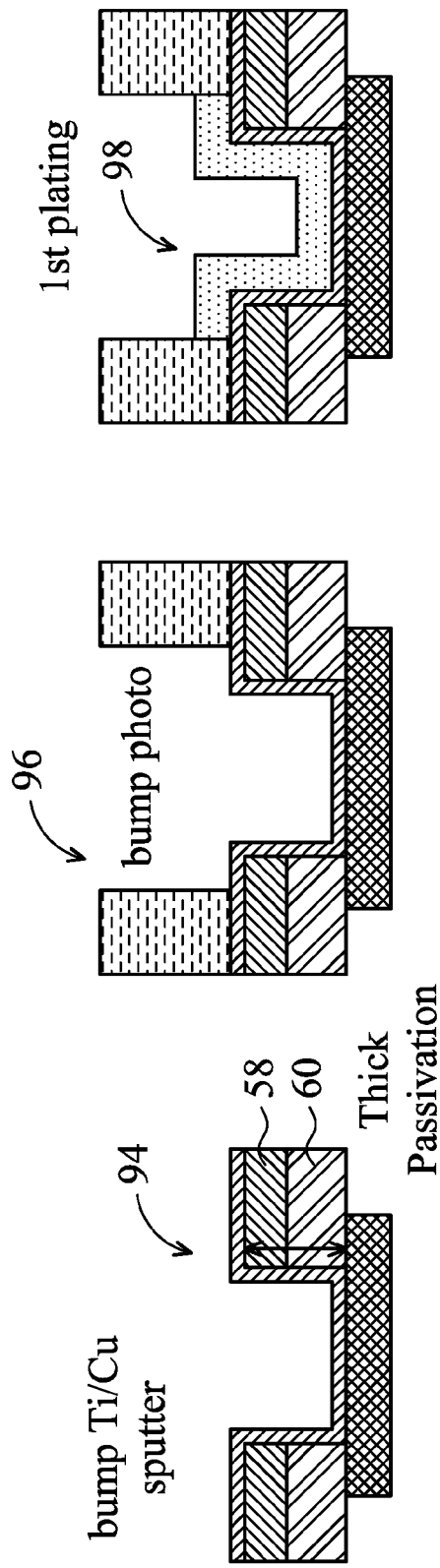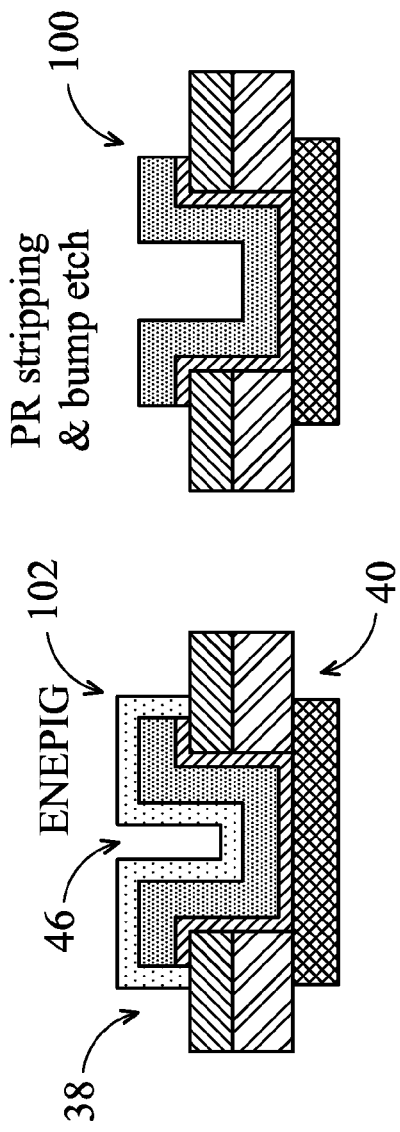
Fig. 12a
Fig. 12b
Fig. 12c
Fig. 12d
Fig. 12e

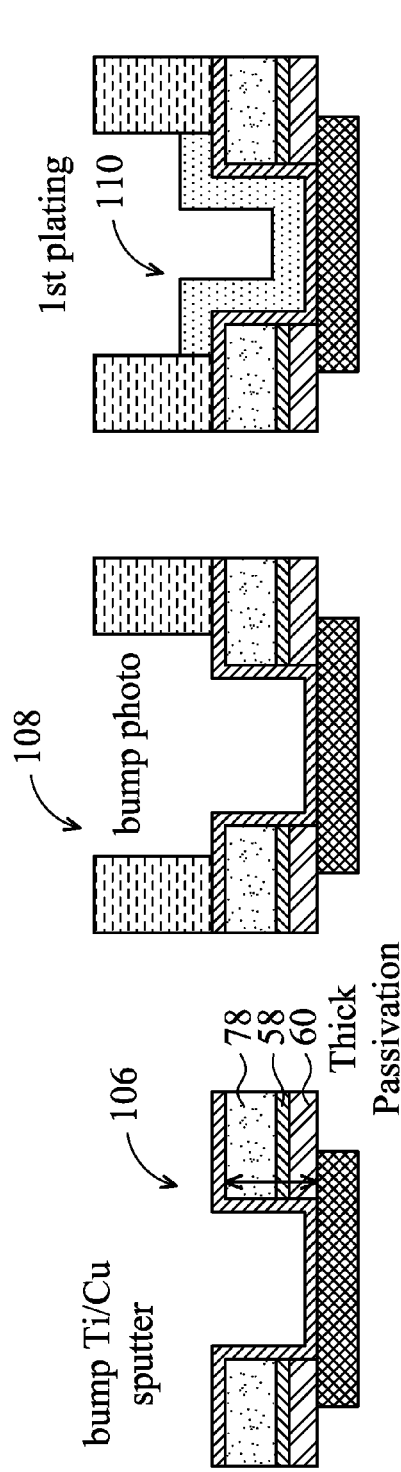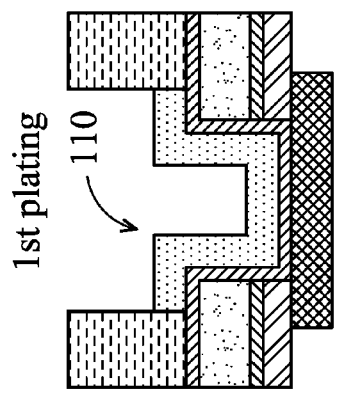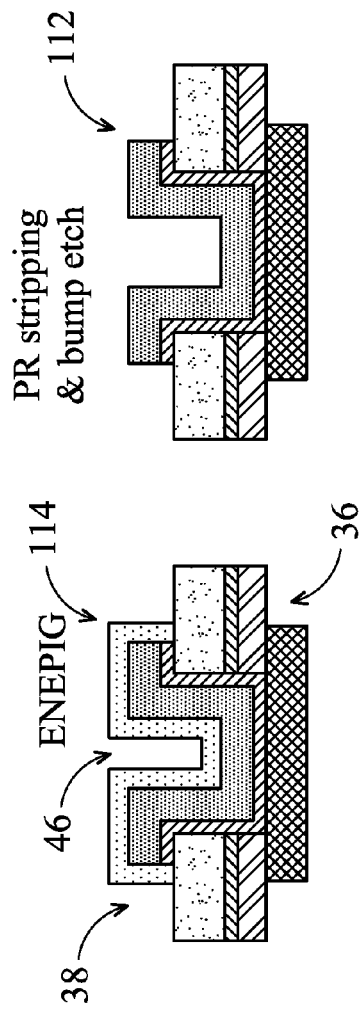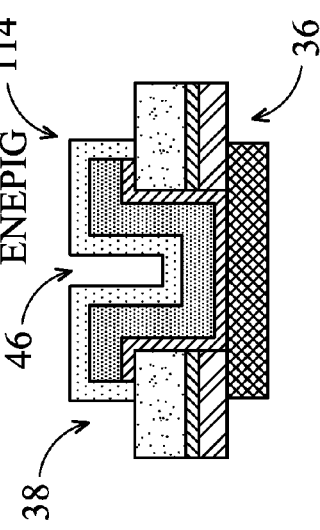

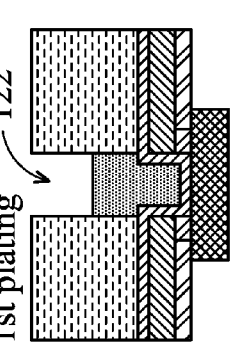
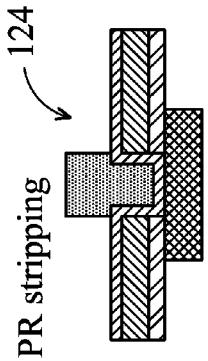
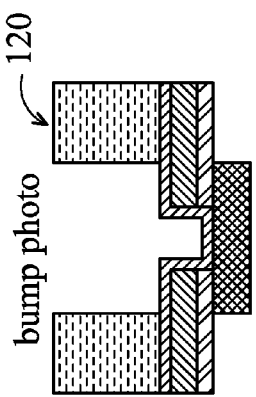
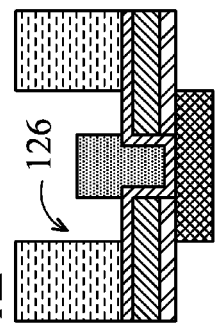
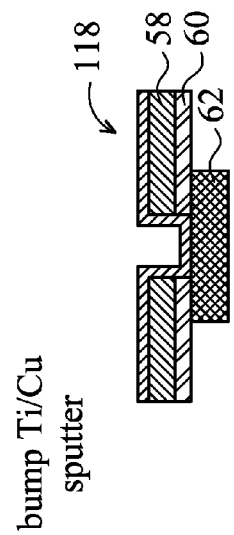
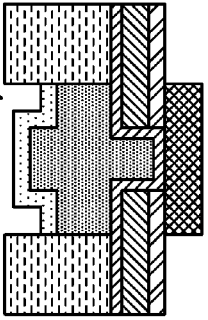
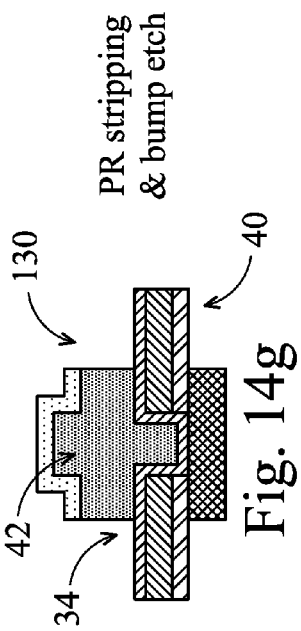

BUMP STRUCTURE FOR YIELD IMPROVEMENT

This application is a divisional application of U.S. patent application Ser. No. 13/558,082, filed Jul. 25, 2012, entitled Bump Structure for Yield Improvement," which application is incorporated herein by reference.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

As the demand for smaller electronic products grows, manufacturers and others in the electronics industry continually seek ways to reduce the size of integrated circuits used in the electronic products. In that regard, three-dimensional type integrated circuit packaging techniques have been developed and used.

One packaging technique that has been developed is Package-on-Package (PoP). As the name implies, PoP is a semiconductor packaging innovation that involves stacking one package on top of another package. In PoP package designs, the top package may be interconnected to the bottom package by reflowing a solder paste disposed on opposing copper bumps to form an electrical connection between the packages.

BRIEF DESCRIPTION OF THE DRAWINGS

For a more complete understanding of the present disclosure, and the advantages thereof, reference is now made to the following descriptions taken in conjunction with the accompanying drawing, in which:

FIGS. 1a-1b illustrate an embodiment bump structure having opposing bumps with non-flat surfaces;

FIGS. 1c-1d illustrate the bump structure of FIGS. 1a-1b after the opposing bumps have been brought together and a reflow process has been performed to form a solder joint;

FIGS. 2a-2b illustrate an embodiment bump structure having opposing bumps of different diameters and with non-flat surfaces;

FIGS. 2c-2d illustrate the bump structure of FIGS. 2a-2b after the opposing bumps have been brought together and a reflow process has been performed to form a solder joint;

FIGS. 7a-7e and 8 illustrate a simulation of a bump crack test during a temperature cycle test (TCT);

FIGS. 11a-11g collectively illustrate an embodiment method of forming the first bump having the convex projection on the first semiconductor component (e.g., a top die);

FIGS. 12a-12e illustrate an embodiment method of forming the second bump having the concave recess on the second semiconductor component (e.g., a bottom die);

FIGS. 13a-13e collectively illustrate an embodiment method of forming the second bump having the concave recess on the first semiconductor component; and FIGS. 14a-14g collectively illustrate an embodiment method of forming the first bump having the convex projection on the first semiconductor component.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 3A:
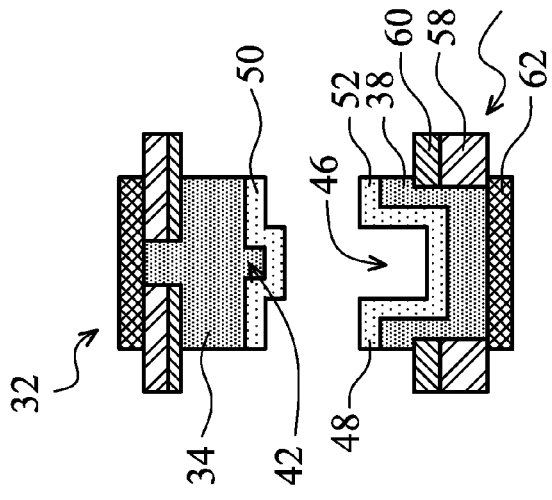
FIGS. 3a-3b illustrate an embodiment bump structure having opposing bumps with non-flat surfaces where a non-flat shape of the lower bump is dictated by the underlying semiconductor structure.

The making and using of embodiments are discussed in detail below. It should be appreciated, however, that the present disclosure provides many applicable concepts that can be embodied in a wide variety of specific contexts. The specific embodiments discussed are merely illustrative, and do not limit the scope of the disclosure.

The present disclosure will be described with respect to preferred embodiments in a specific context, namely electrically coupling a package-on-package (PoP) semiconductor device. The concepts in the disclosure may also apply, however, to other semiconductor structures or circuits.

Bump structures are used to electrically couple top and bottom packages. A conventional bump structure typically includes opposing copper bumps, each of which has a flat bump surface covered by solder paste. When the opposing copper bumps are brought together and the solder paste is reflowed, the top and bottom packages become electrically joined together.

Unfortunately, it has been discovered that the flat bump surface on the copper bumps and used in conventional bump structures may lead to undesirable results. For example, if an inappropriate volume or amount of solder paste is used, a bridge may be formed between adjacent solder joints. In addition, a cold joint may be detrimentally formed. The flat bump surfaces may also elevate the risk of a bump crack being formed during a pull test. Moreover, the flat bump surfaces may permit an electromigration (EM) failure to occur.

The bump structure 32 of FIGS. 1a-1d is configured to alleviate one or more of the above-mentioned problems. The bump structure 32 is also configured to improve yield results. As shown in FIGS. 1a-1b, which depicts the bump structure 32 prior to a solder reflow and joint formation process, the bump structure 32 includes a first bump 34 supported by a first semiconductor component 36 and a second bump 38 supported by a second semiconductor component 40.

As shown in the cross section of FIG. 1b, the first bump 34 includes a convex projection 42 inward of a first flat shoulder portion 44 and the second bump 38 includes a corresponding concave recess 46 inward of a second flat shoulder portion 48. As used herein, the term "convex" and the term "concave" each generally refer to any non-flat surface and do not limit the disclosure to a rounded structure. In an embodiment, the convex projection 42 is generally vertically aligned with the concave recess 46. In an embodiment, the convex projection 42 and the concave recess 46 are oriented in the center of the opposing outer surfaces of the first and second bumps 34, 38, respectively.

Despite the first bump 34 being supported by the first semiconductor component 36 and the second bump 38 being supported by the second semiconductor component 40 in FIGS. 1a-1b, in an embodiment their positions may be reversed. In other words, one of the joining structures has a recess while the corresponding work piece has a protruding feature to match or mate with that recess. Indeed, the concave recess 46 may be positioned above the convex projection 42. Notably, each of the protruding structures and the corresponding recesses may have or resemble a variety of different shapes (or portions thereof) when a cross-section is viewed from the side including, but not limited to, a circle, triangle, square, rectangle, oval, hexagon, and the like.

Still referring to FIGS. 1a-1b, the bump structure 32 also includes a first layer of solder 50 disposed over the first bump 34 and a second layer of solder 52 disposed over the second bump 38. In an embodiment, the first and/or second layers of solder 50, 52 have a thickness between about 2 μm and about 12 μm. In an embodiment, the first layer of solder 50 covers the entire surface of the first bump 34, including the convex projection 42. Therefore, the first layer of solder 50 is also convex due to the underlying convex projection 42 of the first bump 34. In an embodiment, the second layer of solder 52 covers the entire surface of the second bump 38, including the concave recess 46. Therefore, the second layer of solder 52 is also concave due to the underlying concave recess 46.

In an embodiment, the first and second layers of solder 50, 52 only cover the convex projection 42, the concave recess 46, and a portion of first and second flat shoulder portions 44, 48, respectively. In other words, the first and second layers of solder 50, 52 may not extend all the way across the entire bump surface. In an embodiment, each of the first and second layers of solder 50, 52 is formed from a lead-free solder.

In an embodiment, the first layer of solder 50 has a generally uniform thickness over the convex projection 42 and the first flat shoulder portion 44. Likewise, in an embodiment the second layer of solder 52 has a generally uniform thickness over the concave recess 46 and the second flat shoulder portion 48. In another embodiment, the thickness of the first layer of solder 50 varies over the convex projection 42 and the first flat shoulder portion 44 and/or the thickness of the second layer of solder 52 varies over the concave recess 46 and the second flat shoulder portion 48.

Referring to FIGS. 1a-1b, in an embodiment a diameter 54 of the solder-coated first bump 34 is equal (or substantially equivalent to) a diameter 56 of the solder-coated second bump 38.

In an embodiment, the first and second bumps 34, 38 are formed from copper or other suitable bump material. In an embodiment, the first and second semiconductor components 36, 40 may be a die, a wafer, an integrated circuit, and so on. As shown in FIGS. 1a-1b, in an embodiment a portion of each of the first and second bumps 34, 38 is embedded within first and second passivation layers 58, 60 and in contact with a metal pad 62. In an embodiment, the first passivation layer 58 is formed from an undoped silicate glass (USG), the second passivation layer 60 is formed from silicon nitride (SiN), and the metal pad 62 is formed from aluminum (Al). Even so, other suitable materials may be also be used. In addition, additional layers, such as a polyimide (PI) layer, may be found in the first and second semiconductor components 36, 40.

Referring now to FIGS. 1c-1d, the first and second layers of solder 50, 52 are configured to form a solder joint 64 when the first and second bumps 34, 38 are brought together and a reflow process is performed. As shown, the convex projection 42 of the first bump 34 generally extends into the solder joint 64 and the solder joint 64 generally fills the concave recess 46 of the second bump 38. In such an embodiment, the exposed surfaces 66 of the solder joint 64 are generally rounded.

Referring now to FIGS. 2a-2d, in an embodiment the diameter 54 of the solder-coated first bump 34 is less than the diameter 56 of the solder-coated second bump 38. In such an embodiment, the exposed surface 66 of the solder joint 64 is generally angled (i.e., increasing in width from top to bottom as shown in FIG. 2d).

Figure 3B:
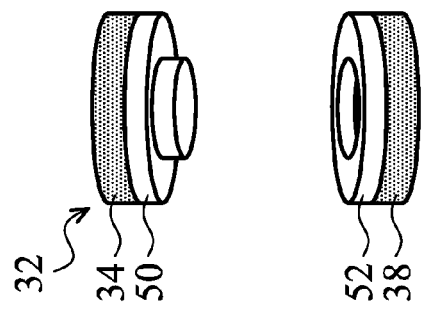
Figure 3C:
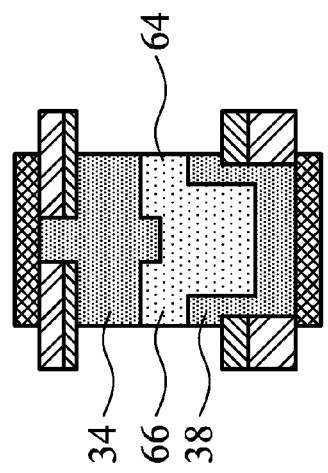
FIGS. 3c-3d illustrate the bump structure of FIGS. 3a-3b after the opposing bumps have been brought together and a reflow process has been performed to form a solder joint.
Figure 3D:
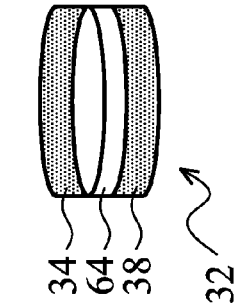
Figure 4A:
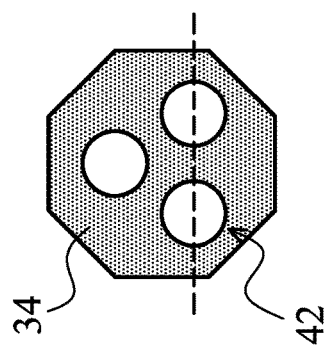
FIGS. 4a-4b illustrate an embodiment bump structure incorporating two projections on a top bump and two corresponding recesses on a bottom bump.
Figure 4B:
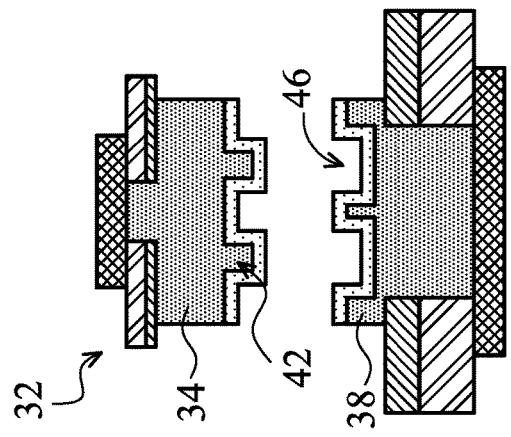
Figure 5A:
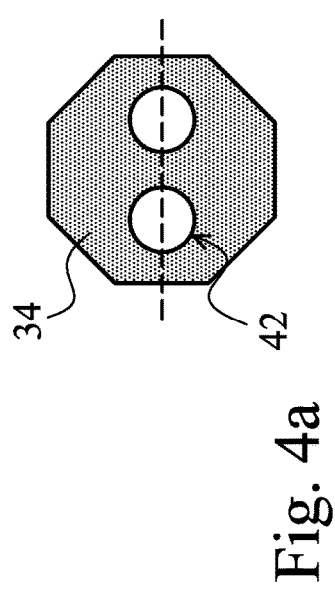
FIGS. 5a-5b illustrate an embodiment bump structure incorporating a plurality of projections on a top bump and a plurality of corresponding recesses on a bottom bump.
Figure 5B:
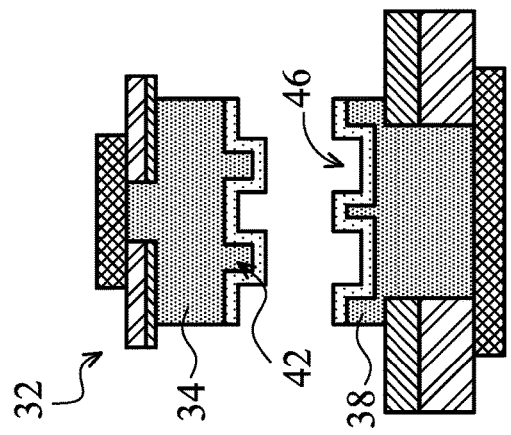

Referring now to FIGS. 3a-3d, in an embodiment the shape of the concave recess 46 of the second bump 38 is defined by the underlying semiconductor structure 68 or scheme FIG. 3b). Indeed, the concave recess 46 generally has a profile that matches the amount of second bump 38 material embedded in the first and second passivation layers 58, 60 and the metal pad 62. In other words, the collectively thickness of first and second passivation layers 58, 60 and the metal pad 62 is approximately the same as a depth that the concave recess 46 extends below the second flat shoulder portion 48. In such an embodiment, the exposed surface 66 of the solder joint 64 is generally co-planar with the adjacent sidewalls of the first and second bumps 34, 38 as shown in FIG. 3d.

Referring now to FIGS. 4a-4b and 5a-5b, in an embodiment the first bump 34 may include two or more (e.g., a plurality) convex projections 42 and the second bump 38 may include two or more concave recesses 46. As shown in FIGS. 4a-4b and 5a-5b, the plurality of convex projections 42 and the plurality of concave recesses 46 may be oriented in a variety of different formations on the first and second bumps, respectively. In other words, the plurality of convex projections 42 and the plurality of concave recesses 46 may be formed in different patterns and in different numbers.

Referring now to FIGS. 6a-6d, the first and second bumps 34, 38 depicted in FIGS. 1a-1d, 1a-1d, and 1a-1d may be formed using a particular design profile 70 where h1 is a bump height, w1 is a bump width, h2 is both a convex projection height and a concave recess depth, and w2 is both a convex projection width and concave recess width.

In an embodiment, h1 is between about 25 μm to about 100 μm and h2 is between about 6.25 μm to about 50 μm. In an embodiment, w1 is between about 25 μm to about 100 μm and w2 is between about 6.25 μm to about 50 μm. In an embodiment, the ratio of h2/h1 is between about 0.25 to 1. In an embodiment, the ratio of w2/w1 is between about 0.25 to 1.

Figure 6B:
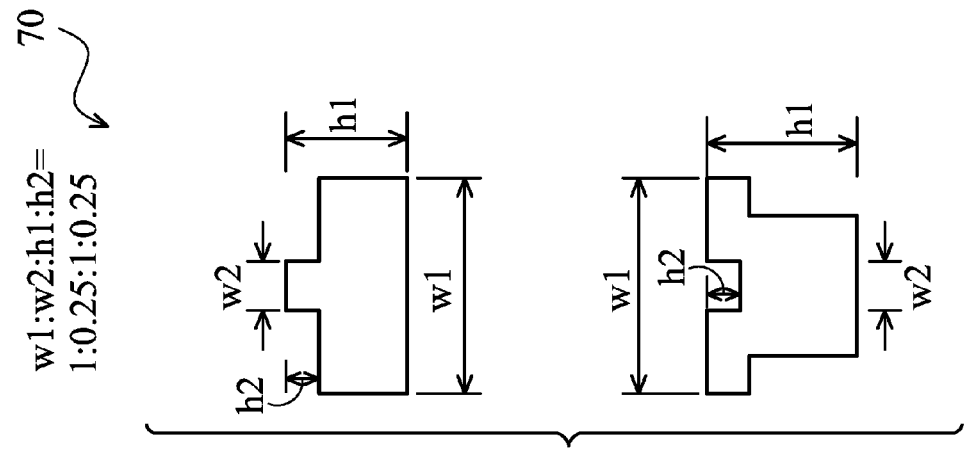
FIGS. 6a-6d illustrate example design profiles and dimensions for embodiments of the bump structure disclosed herein.
Figure 6A:
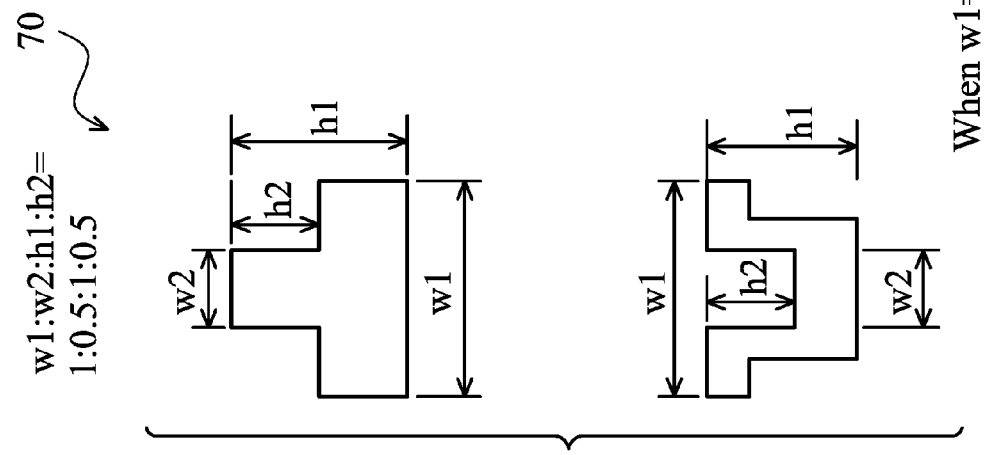
Figure 6C:
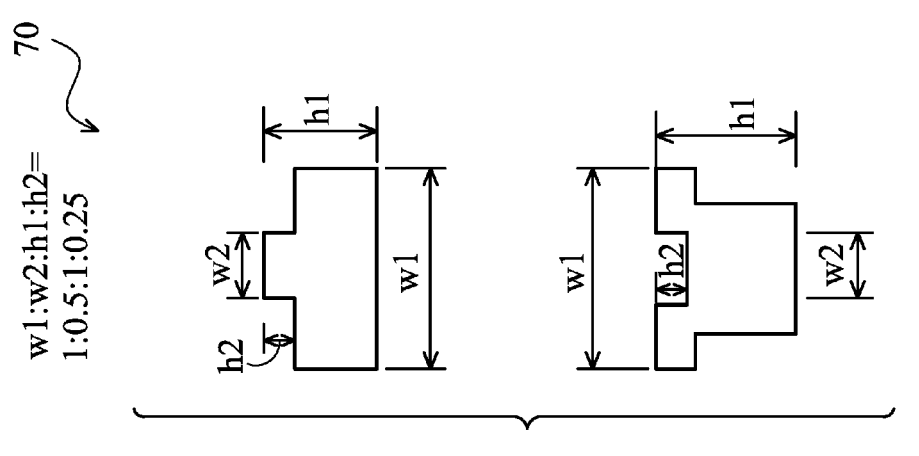

In the embodiment shown in FIG. 6a, the design profile 70 is represented by w1:w2:h1:h2=1:0.5:1:0.5. In the embodiment shown in FIG. 6b, the design profile 70 is represented by w1:w2:h1:h2=1:0.25:1:0.25. In the embodiment shown in FIG. 6c, the design profile 70 is represented by w1:w2:

h1:h2=1:0.25:1:0.5. In addition, in the embodiment shown in FIG. 6d, the design profile 70 is represented by w1:w2: h1:h2=1:0.5:1:0.5.

Figure 6D:
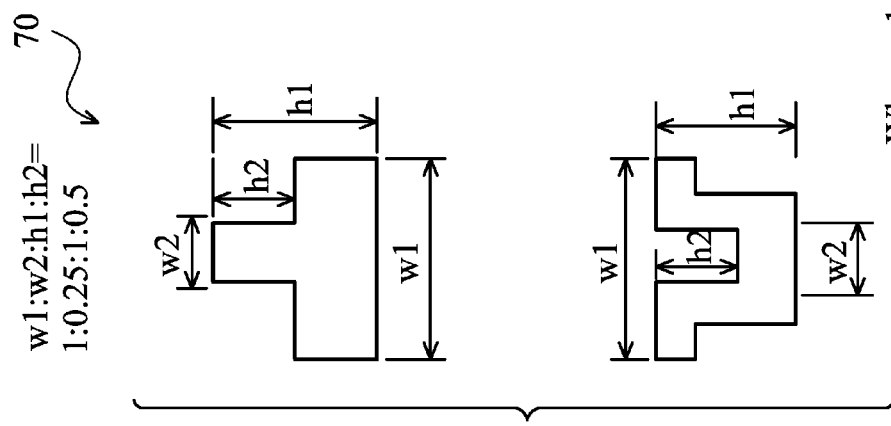

By way of example, if w1 is 50 µm and the design profile 70 of FIG. 11c is selected, the dimensions would be: w1=50 µm, w2=12.5 µm, h1=50 µm, and h2=25 µm. As another example, if w1 is 25 µm and the design profile 70 of FIG. 6d is selected, the dimensions would be: w1=25 µm, w2=12.5 µm, h1=25 µm, and h2=6.25 µm. It should be recognized that other design profiles and other starting w1 dimensions may be implemented in other embodiments. Indeed, in an embodiment h1 may be as small as about 5 µm and h2 may be as small as about 0.93 µm.

Figure 8:
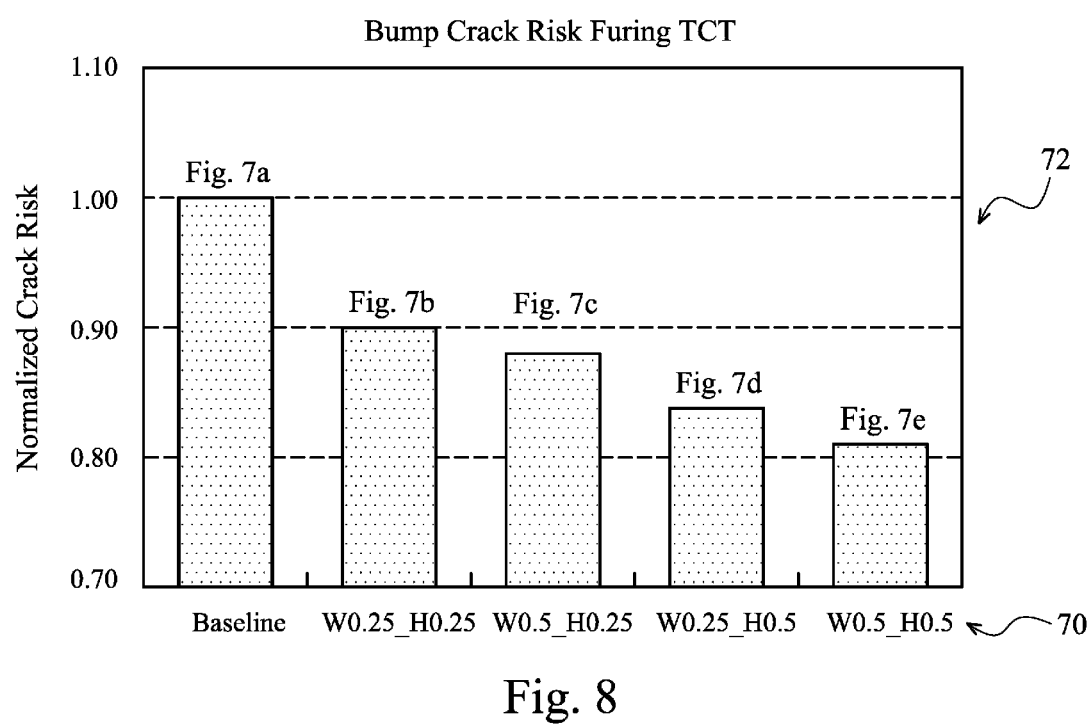

Referring now to FIGS. 7a-7e and 8, a simulation of a bump crack test during a temperature cycle test (TCT) was performed. In the simulation, the reference bump structure of FIG. 7a was used as a baseline and compared to embodiments of the bump structure 32 with varying design profiles 70 as illustrated in FIGS. 7b-7e. The results 72 of the simulation are depicted in FIG. 8 in the form of a bar graph. As shown in FIG. 8, the bump structures 32 of FIGS. 7b-7e are projected to have a lower stress level at maximum stress area 74 relative to the reference bump structure of FIG. 7a.

Figure 10:
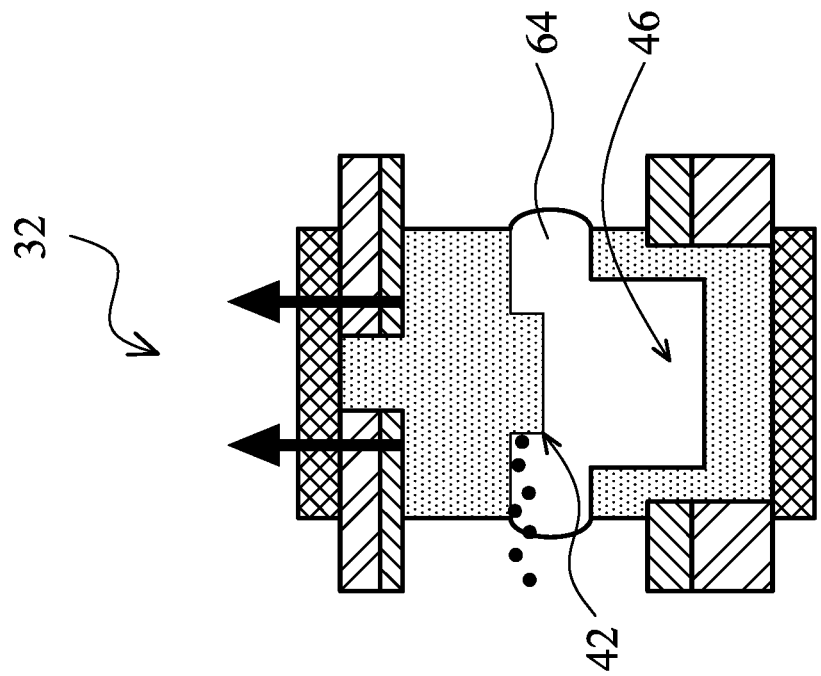
FIG. 10 illustrates prevention of solder crack propagation through embodiments of the bump structure disclosed herein.
Figure 9:
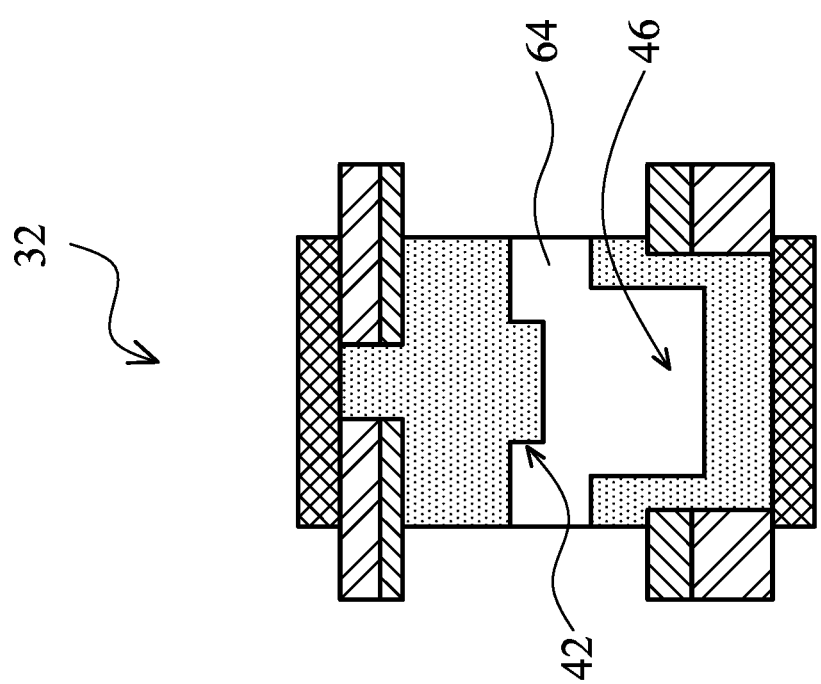
FIG. 9 represents the suitable electrical and mechanical connection provided by embodiment bump structures disclosed herein.

Referring now to FIGS. 9-10, the bump structure 32 disclosed herein provides numerous advantages compared to the conventional bump structure having flat surfaces. For example, the bump structure 32 enhances self-assembly of the solder joint 64 with increasing cohesive force between the complementary convex projection 42 and concave recess 46.

In addition, the bump structure 32 provides a better solder volume control window and better joint yield performance than the conventional bump structure. The bump structure 32 also improves solder bump confinement. Indeed, the convex projection 42 helps with solder centralization formation and the concave recess 46 permits more space for solder to flow inwardly.

Continuing, the bump structure 32 also offers a reduced bridge risk with a slender solder bump. The bump structure 32 avoids cold joint issues and provides increased bump surface area for the solder joint 46 (relative to a solder joint of the conventional bump structure). The bump structure 32 enhances reliability performance and improves the pull/shear stress resistivity along the solder/copper bump crack path as shown in FIG. 10. Indeed, while the conventional bump structure permits a solder crack to continue to propagate along a solder crack path (shown in dashed lines), the bump structure 32 of FIG. 10 stops the solder crack from progressing. Finally, the bump structure 32 reduces the risk of electromigration failure. Thus, the improved solder joint 46 of the bump structure 32 beneficially affects yield, reliability, and electromigration performance.

Referring collectively to FIGS. 11a-11g, an embodiment method of forming the first bump 34 having the convex projection 42 on the first semiconductor component 36 (e.g., a top die) is collectively and schematically illustrated. As shown in FIG. 11a, a titanium/copper (Ti/Cu) sputtering process 76 is performed over the first and second passivation layers 58, 60, a polyimide (PI) layer 78, and the metal pad 62. The thickness of the Ti/Cu may be between about 500 Å/3000 Å and about 1000 Å/5000 Å. Next, as shown in FIG. 11b a photo resist process 80 is performed to protect portions of the underlying structure with a photo resist. Thereafter, as shown in FIG. 11c a first plating process 82 is performed to provide a portion of the first bump 34. In an embodiment, the material used for the first plating is copper and the thickness of the copper is between about 8 µm and about 13 µm. Next, as shown in FIG. 11d the photo resist stripping process 84 is performed to remove the photo resist. Continuing, a second photo resist process 86 as shown in FIG. 11e and a second plating process 88 as shown in FIG. 11f are performed. In an embodiment, the material used for the second plating is copper and lead-free solder. The thickness of the copper is between about 15 µm and about 25 µm and the thickness of the lead-free solder is between about 2 µm and about 12 µm. Finally, another photo resist stripping process and a bump etch process 90 are performed as shown in FIG. 11g to complete the formation of the first bump 34 of the bump structure 32. The methods disclosed herein may be referred to as, for example, chemical tuning or have a chemical tuning aspect.

Referring collectively to FIGS. 12a-12e, an embodiment method of forming the second bump 38 having the concave recess 46 on the second semiconductor component 40 (e.g., a bottom die) is collectively and schematically illustrated. As shown in FIG. 12a, a titanium/copper (Ti/Cu) sputtering process 94 is performed over the first and second passivation layers 58, 60 and the metal pad 62. The thickness of the Ti/Cu may be between about 500 Å/3000 Å and about 1000 Å/5000 Å. In FIG. 12a, the first and second passivation layers 58, 60 are "thick" as represented by the arrow in FIG. 12a. In an embodiment, the first and second passivation layers 58, 60 have a thickness of between about 2 µm and about 7 µm. Next, as shown in FIG. 12b, a photo resist process 96 is performed to protect portions of the underlying structure with a photo resist. Thereafter, as shown in FIG. 12c a first plating process 98 is performed. In an embodiment, the material used for the first plating is copper and the thickness of the copper is between about 10 µm and about 15 µm. Next, as shown in FIG. 12d, a photo resist stripping process and a bump etch process 100 are performed. In an embodiment an electroless nickel electroless palladium immersion gold (ENEPIG) process 102 is performed to complete the second bump 38 as shown in FIG. 12e. In one embodiment, the thickness of a nickel-palladium-gold alloy layer deposited by the ENEPIG process is in a range from about 0.3 µm to about 1 µm. The nickel-palladium-gold alloy layer is merely an example. Other types of applicable metals or metal alloys may also be used.

Referring collectively to FIGS. 13a-13e, an embodiment method of forming the second bump 38 having the concave recess 46 on the first semiconductor component 36 (e.g., a top die) is collectively and schematically illustrated. As shown in FIG. 13a, a titanium/copper (Ti/Cu) sputtering process 106 is performed over the first and second passivation layers 58, 60, a polyimide (PI) layer 78, and the metal pad 62. The thickness of the Ti/Cu may be between about 500 Å/3000 Å and about 1000 Å/5000 Å. In FIG. 13a, the first and second passivation layers 58, 60 and the polyimide (PI) layer 78 collectively have a thickness of between about 2 µm and about 7 µm. Next, as shown in FIG. 13b, a photo resist process 108 is performed to protect portions of the underlying structure with a photo resist. Thereafter, as shown in FIG. 13c a first plating process 110 is performed. In an embodiment, the material used for the first plating is copper and the thickness of the copper is between about 5 µm and about 15 µm. Next, as shown in FIG. 13d, a photo resist stripping process and a bump etch process 112 are performed. An electroless nickel electroless palladium immersion gold (ENEPIG) process 114 is performed to complete the second bump 38 as shown in FIG. 13e. In one embodiment, the thickness of the nickel-palladium-gold alloy layer deposited by the ENEPIG process is in a range from about 0.3 µm to about 1 µm. The nickel-palladium-gold alloy layer is merely an example. Other types of applicable metals or metal alloys may also be used.

Referring collectively to FIGS. 14a-14g, an embodiment method of forming the first bump 34 having the convex projection 42 on the second semiconductor component 40 (e.g., a bottom die) is collectively and schematically illustrated. As shown in FIG. 14a, a titanium/copper (Ti/Cu) sputtering process 118 is performed over the first and second passivation layers 58, 60 and the metal pad 62. The thickness of the Ti/Cu may be between about 500 Å/3000 Å and about 1000 Å/5000 Å. Notably, the polyimide (PI) layer 78 is not used in this particular embodiment. Next, as shown in FIG. 14b, a photo resist process 120 is performed to protect portions of the underlying structure with a photo resist. Thereafter, as shown in FIG. 14c a first plating process 122 is performed. In an embodiment, the material used for the first plating is copper and the thickness of the copper is between about 5 μm and about 15 μm. Next, as shown in FIG. 14d, the photo resist stripping process 124 is performed to remove the photo resist. Continuing, a second photo resist process 126 as shown in FIG. 14e and a second plating process 128 as shown in FIG. 14f are performed. In an embodiment, the material used for the second plating is copper and lead-free solder. The thickness of the copper is between about 10 μm and about 25 μm and the thickness of the lead-free solder is between about 2 μm and about 12 μm. Another photo resist stripping process and a bump etch process 130 are performed as shown in FIG. 14g to complete the formation of the first bump 34 of the bump structure 32.

In an embodiment, a bump structure for electrically coupling semiconductor components includes a first bump on a first semiconductor component, the first bump having a first non-flat portion, a second bump on a second semiconductor component, the second bump having a second non-flat portion, and a solder joint formed between the first and second non-flat portions to electrically couple the semiconductor components.

In an embodiment, a bump structure for electrically coupling semiconductor components including a first bump on a first semiconductor component, the first bump having a convex projection, a first layer of solder disposed over the first bump, a second bump on a second semiconductor component, the second bump having a concave recess, a second layer of solder disposed over the second bump, the second layer of solder configured to form a solder joint with the first layer of solder when the first and second bumps are brought together and a reflow process is performed.

In an embodiment, a method of forming a bump structure includes forming a first non-flat portion on a first bump, the first bump supported by a first semiconductor component, covering the first bump with a first material, forming a second non-flat portion on a second bump, the second bump supported by a second semiconductor component, and covering the second non-flat portion with a second material.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method of forming a semiconductor device, the method comprising:

forming a first non-flat portion on a first bump, the first non-flat portion having a plurality of discrete recesses;

covering the first bump with a first material;

forming a second non-flat portion on a second bump, the second non-flat portion having a plurality of projections, the first non-flat portion having a same number of recesses as the second non-flat portion has projections;

covering the second non-flat portion with a second material;

laterally aligning the recesses of the first non-flat portion with the projections of the second non-flat portion; and reflowing the first material and the second material, thereby forming a bond between the first non-flat portion and the second non-flat portion.

2. The method of claim 1, wherein the second material is solder and the first material is electroless nickel electroless palladium immersion gold.

3. The method of claim 1, wherein the second non-flat portion comprises a flat shoulder along a periphery.

4. The method of claim 1, wherein forming the second non-flat portion on the second bump comprises:

forming a first patterned mask over a first passivation layer, the first passivation layer having a first opening, the first opening exposing a first contact pad, the first patterned mask having a second opening, the first contact pad being laterally over in the second opening;

forming a first conductive element in the second opening, the first conductive element extending above an upper surface of the first passivation layer;

removing the first patterned mask;

forming a second patterned mask over the first passivation layer, the second patterned mask having a third opening, a width of the third opening being greater than a width of the first conductive element; and forming a second conductive element over the first conductive element in the third opening, the first conductive element and the second conductive element forming the second non-flat portion on the second bump.

5. The method of claim 4, wherein forming the first non-flat portion on the first bump comprises:

forming a third patterned mask over a second passivation layer, the second passivation layer having a fourth opening, the fourth opening exposing a second contact pad, the third patterned mask having a fifth opening, the fifth opening being laterally over the second contact pad and an upper surface of the second passivation layer; and forming a second conductive element in the fifth opening, the second conductive element extending above an upper surface of the second passivation layer, an upper surface of the second conductive element having a second recess within the fourth opening, the second conductive element forming the first non-flat portion on the first bump.

6. The method of claim 1, wherein after reflowing a first projection of the projections extends into a first recess of the recesses.

7. A method of forming a device, the method comprising:

forming a passivation layer over a substrate, the substrate having a contact pad, the passivation layer having a first opening, the first opening exposing the contact pad;

forming a first patterned mask over the passivation layer, the first patterned mask having a second opening, the contact pad being laterally below the second opening;

forming a first conductive element in the second opening, the first conductive element extending above an upper surface of the passivation layer;

removing the first patterned mask;

forming a second patterned mask over the passivation layer, the second patterned mask having a third opening, a width of the third opening being greater than a width of the first conductive element;

forming a second conductive element over the first conductive element in the third opening, the first conductive element and the second conductive element forming a first bump having a first projection;

after forming the second conductive element, removing the second patterned mask; and attaching the first bump to a second bump, the second bump having a first recess, wherein after the attaching the first projection is aligned with the first recess.

8. The method of claim 7, further comprising forming an insulating layer along sidewalls of the first opening.

9. The method of claim 8, wherein the insulating layer extends along an upper surface of the passivation layer.

10. The method of claim 8, wherein the second conductive element extends over an upper surface of the insulating layer.

11. The method of claim 8, wherein a width of the third opening is less than a width of the insulating layer.

12. The method of claim 7, further comprising, prior to forming the first patterned mask, sputtering a conductive layer over the passivation layer, the first patterned mask being on the conductive layer.

13. The method of claim 12, wherein the conductive layer comprises a Ti layer and a Cu layer.

14. A method of forming a device, the method comprising:

forming a first passivation layer over a first substrate, the first substrate having a first contact pad, the first passivation layer having a first opening, the first opening exposing the first contact pad;

forming a first patterned mask over the first passivation layer, the first patterned mask having a second opening over the contact pad and an upper surface of the first passivation layer being exposed in the second opening;

forming a first conductive element in the second opening, the first conductive element extending above an upper surface of the first passivation layer, an upper surface of the first conductive element having a first recess within the first opening, the first conductive element forming a first bump;

removing the first patterned mask;

forming a second conductive element over the first conductive element, the second conductive element having a lower reflow temperature than the first conductive element;

forming a first projection of a second bump on a second substrate, comprising:

forming a second patterned mask over a second passivation layer, the second passivation layer having a second opening, the second opening exposing a second contact pad, the second patterned mask having a third opening, the second contact pad being under in the third opening;

forming a third conductive element in the third opening, the third conductive element extending above an upper surface of the second passivation layer;

removing the second patterned mask;

forming a third patterned mask over the second passivation layer, the third patterned mask having a fourth opening, a width of the fourth opening being greater than a width of the third conductive element;

forming a fourth conductive element over the third conductive element in the fourth opening, the fourth conductive element and the third conductive element forming the second bump; and forming a fifth conductive element over the fourth conductive element;

aligning the first projection of the second bump on the second substrate to the first recess of the first bump; and reflowing the second conductive element and the fifth conductive element.

15. The method of claim 14, wherein forming the first passivation layer comprises forming a second passivation layer and a third passivation layer over the second passivation layer.

16. The method of claim 15, wherein sidewalls of the second passivation layer are continuous with sidewalls of the third passivation layer.

17. The method of claim 14, further comprising, prior to forming the first patterned mask, sputtering a conductive layer on the first passivation layer, the first patterned mask being formed on the conductive layer.

18. The method of claim 17, further comprising, after removing the first patterned mask, removing exposed portions of the conductive layer.

19. The method of claim 18, wherein the second conductive element extends along sidewalls of the first conductive element.

20. The method of claim 14, wherein the second conductive element is interposed between sidewalls of the first opening.

21. The method of claim 14, wherein the first projection is one of a plurality of projections of the second bump.

* * * * *